United States Patent [19]

Lievin

[11] Patent Number: 5,379,192
[45] Date of Patent: Jan. 3, 1995

[54] ELECTRICAL INTERCONNECTION SYSTEM BETWEEN A PLURALITY OF DAUGHTER CARDS

[75] Inventor: Jacques Lievin, Paris, France

[73] Assignee: Amphenol Socapex, France

[21] Appl. No.: 50,065

[22] PCT Filed: Sep. 23, 1992

[86] PCT No.: PCT/FR92/00883
§ 371 Date: May 10, 1993
§ 102(e) Date: May 10, 1993

[87] PCT Pub. No.: WO93/06704
PCT Pub. Date: Apr. 1, 1993

[30] Foreign Application Priority Data

Sep. 23, 1991 [FR] France ................. 91 11686

[51] Int. Cl.$^6$ ........................... H01R 23/68
[52] U.S. Cl. ......................... 361/785; 361/784; 361/760; 361/788; 174/261; 439/61
[58] Field of Search ............ 361/729, 785, 788, 799, 361/784, 760, 792, 796; 439/67, 98, 62; 174/52.4, 261

[56] References Cited

U.S. PATENT DOCUMENTS

| | | | |
|---|---|---|---|
| 3,404,367 | 10/1968 | Henschen | 339/186 M |
| 3,634,816 | 10/1969 | Zell | 339/186 M |
| 4,475,781 | 10/1984 | Asick et al. | 339/17 |
| 4,887,353 | 12/1989 | Preputnick | 29/830 |

OTHER PUBLICATIONS

*Electronics Week*, No. 4, Jan. 21, 1985, New York, USA, pp. 51–54, George Lawrence, "Connectors Boost System".

Primary Examiner—Leo P. Picard
Assistant Examiner—Young Whang
Attorney, Agent, or Firm—Bacon & Thomas

[57] ABSTRACT

The invention relates to an interconnection system between a mother card and a plurality of daughter cards provided with connectors. In order to make it possible to increase the density of interconnections between the mother card (10) and the daughter cards (20, 22, 23), additional direct connections are provided between adjacent connectors in addition to the "conventional" electrical connections provided between the connectors (40, 42) and the bases (12, 14). To do this, additional connection elements (47, 48, 50, 52) connected to conductors inside the connectors are disposed facing one another in the side faces (40b, 42a) of the connectors.

10 Claims, 4 Drawing Sheets

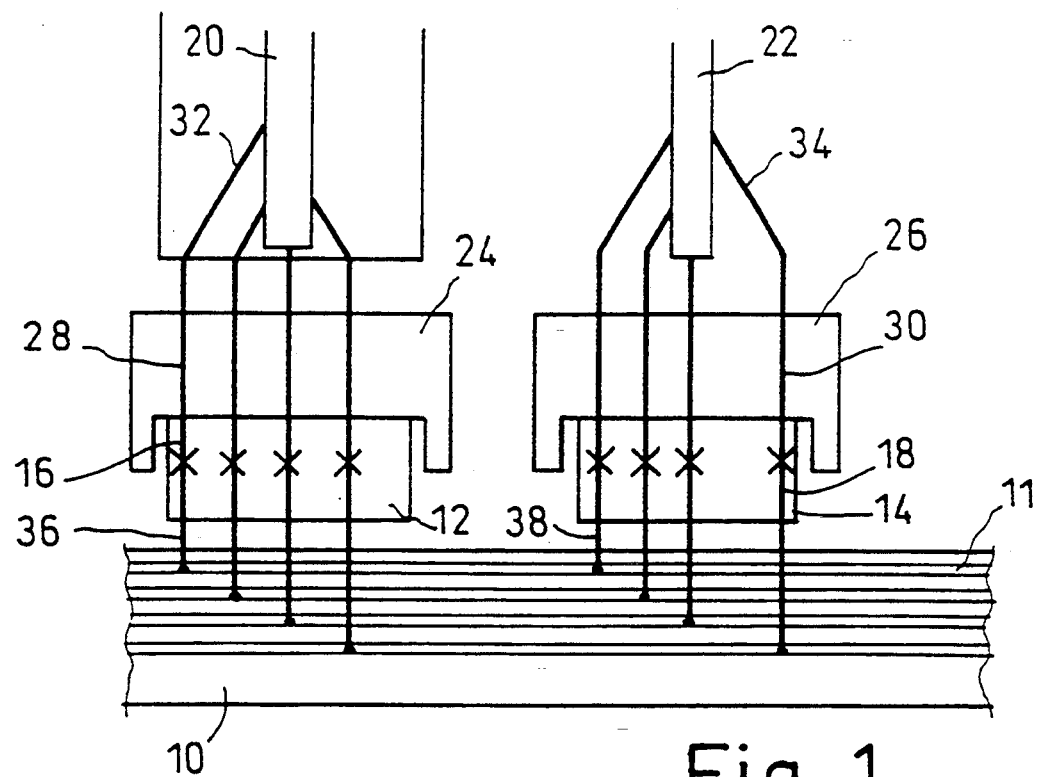
Fig_1
PRIOR ART
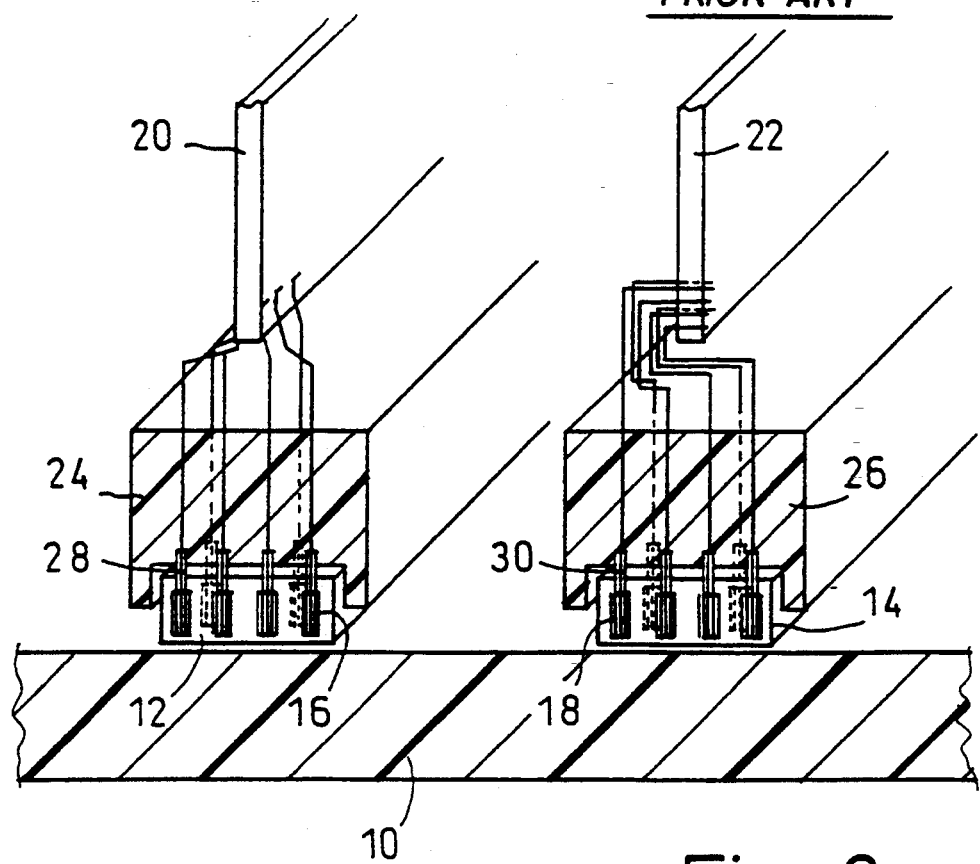
Fig_2

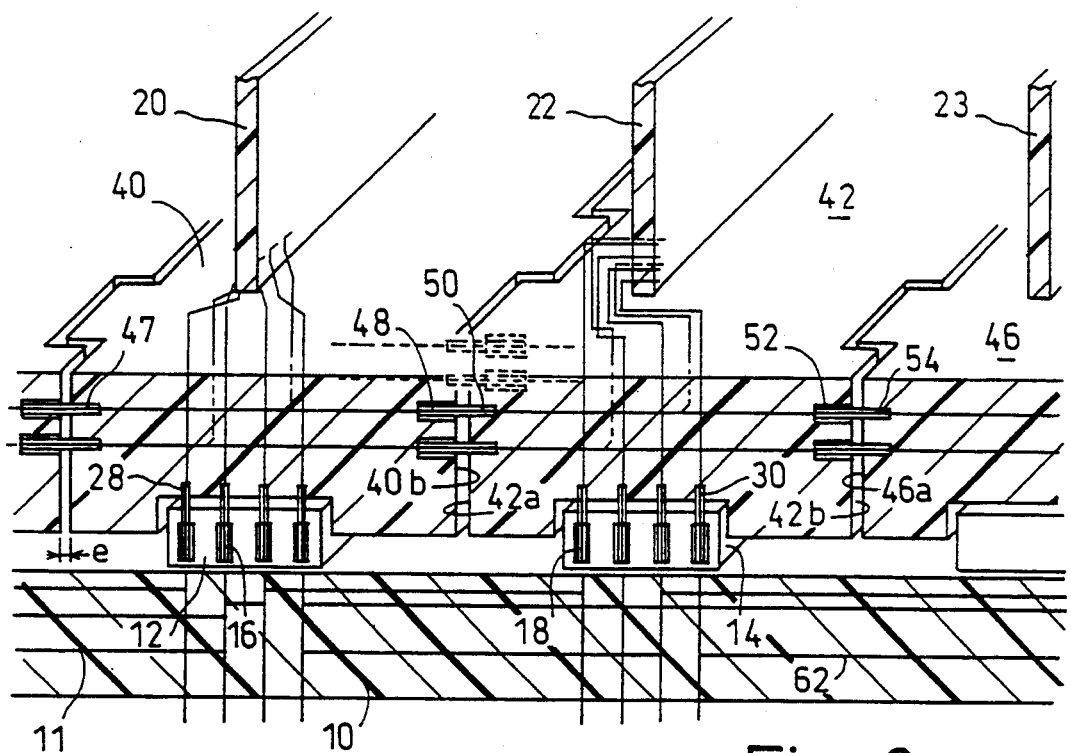
Fig_3
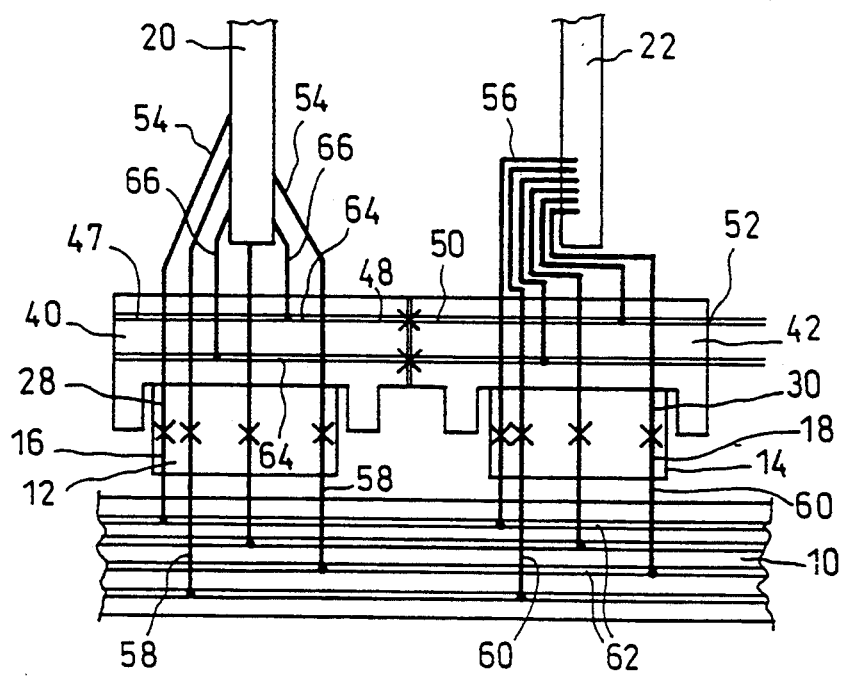
Fig_4

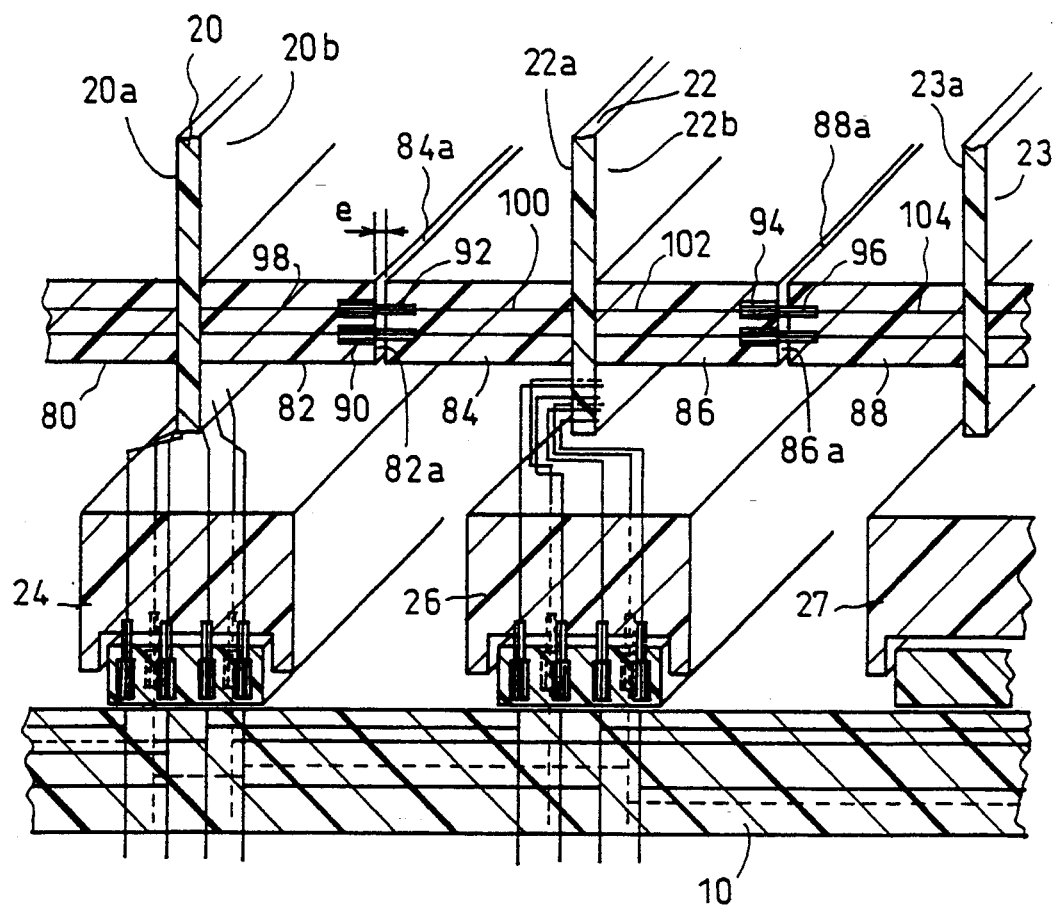
Fig_5

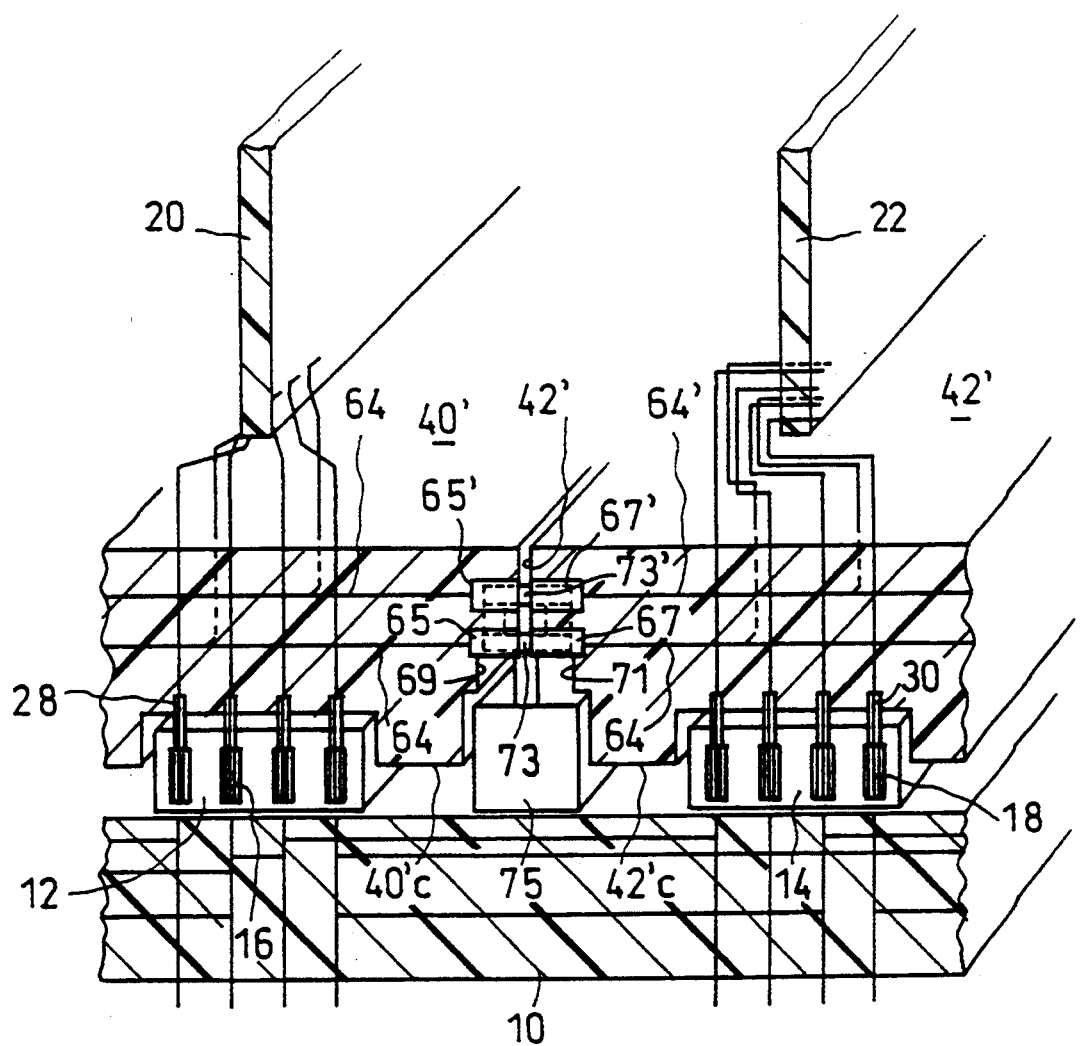
Fig_6

ELECTRICAL INTERCONNECTION SYSTEM BETWEEN A PLURALITY OF DAUGHTER CARDS

BACKGROUND OF THE INVENTION

1. Field of the Invention

The present invention relates to an electrical interconnection system of the type using a "mother" card to interconnect a plurality of "daughter" cards.

2. Description of Related Art

In equipment or installations that include a very large number of electrical or electronic components, the components are generally mounted on cards, i.e. on rigid insulating supports that include conductive tracks for interconnecting the various components mounted on the same card. The card may be single sided or double sided. The equipment or installation naturally includes a plurality of cards.

To interconnect the various cards, i.e. to interconnect the various circuits implemented on the various cards, it is general practice to use a mother card. The mother card is installed and fixed horizontally in a mechanical support referred to as a "chassis". To provide electrical connection between each of the so-called daughter cards and the mother card, the mother card includes mutually parallel bases, and each daughter card includes a connector, with each connector having electrical connection elements that co-operable with corresponding elements in the associated base when the daughter card is installed on the mother card. Co-operation between the base and the connector also serves to provide one of the mechanical connections between a daughter card and the mother card.

In order to enable the various daughter cards mounted on a common chassis to be interconnected to make up a desired circuit, it will be understood that the mother card must itself include conductive tracks or conductor elements serving to electrically interconnect the various conductor elements of the various base connectors appropriately and also to connect them to output terminals of the mother card, i.e. output terminals of the chassis as a whole, i.e. of the circuit constituted by the mother card and the daughter cards connected thereon.

FIGS. 1 and 2 show one such known interconnection system. FIG. 2 is a perspective view of a portion of a mother card 10 with two bases 12 and 14 secured thereto. In this figure, there can be seen a row of connection elements given respective references 16 and 18. There can also be seen two daughter cards 20 and 22 having respective connectors 24 and 26. The connectors are provided with their own connection elements 28 and 30 which co-operate with the connection elements 16 and 18 of the bases 12 and 14 when the daughter cards 20 and 22 are installed on the mother card 10.

FIG. 1 is a diagram of the electrical connections that can be implemented in this way. There can be seen electrical conductors 32 and 34 which connect the connector elements 28 and 30 of the connectors 24 and 26 to conductor tracks (not shown in this figure) of the daughter cards 20 and 22.

There can also be seen the conductors 36 and 38 which connect the connection elements 16 and 18 of the bases to bus-forming conductors 11 of the mother card 10.

In particular, it can be seen that all of the electrical interconnections implemented by the mother card 10 transit via the connection elements between the connectors and the bases.

The mother card which supports the bases that in turn receive the connection elements of the connectors associated with the daughter cards constitutes one of the limits on increasing the level of integration provided by the chassis of which it forms a part. At present, interconnection density in an electronic chassis is increased by adding contacts to the bases and the associated connectors, by miniaturizing the contacts, by adding plated-through holes (PTHs), and by adding electrical conductor layers within the mother card using finer and finer etching line thicknesses to define the conductive tracks. The mother card thus becomes less and less reliable both mechanically and electrically, and in addition more and more expensive because of its greater complexity.

When it is desired to increase the component density of the chassis, various mechanical limitations related to implementing the mother card are encountered. Of such limitations, particular mention may be made of the following:

internal track width;
density of internal conductor tracks;
hole diameter prior to metal plating;
density of plated holes in the mother card;
number of conductor layers in the mother card;
the material from which the card is made;
the planeness of the card; and finally
the dimensions of the mother card.

Increasing component density also encounters a certain number of limits concerning the electrical characteristics of the mother card. Travel time via a mother card is no longer negligible when the length of the conductor tracks need to be increased. It is therefore advantageous to attempt to achieve connections that are as short as possible. In addition, the characteristic impedance of a line makes it possible to ensure that the shape of the signal travelling via a conductor is conserved. However applying impedance constraints would merely add further constraints on the design of circuits in a mother card. Furthermore, increasing track density gives rise to increased probability of cross-talk. Finally, increasing the number of plated-through holes increases the number of tabs associated therewith and gives rise to non-negligible capacitance.

It can thus be seen that there exists a real need to provide an improved way of interconnecting daughter cards by means of a mother card for two purposes: either for given component density to reduce the density of connections on the mother card so as to improve the above-outlined characteristics thereof; or else while maintaining the same quality of characteristics as mentioned above, to further increase the connection density of circuits on the daughter cards.

SUMMARY OF THE INVENTION

Accordingly, it is an object of the present invention is to provide a system of interconnecting daughter cards that enables the above-specified results to be obtained.

According to the invention, this object is achieved by an electrical interconnection system for providing connections between a plurality of daughter cards, the system comprising a mother card including a plurality of bases for establishing electrical connections with a plurality of connectors associated with said daughter cards, the connection elements of each connector being electrically connected to conductor tracks of the associated daughter card, the system being characterized in that at least some of the assemblies constituted by the connector and the associated daughter card include additional electrical connection elements connecting with at least one adjacent assembly constituted by a connector and its associated daughter card, said additional connection elements being distinct from the connection elements connecting the connectors to the bases of the mother card, said additional elements serving to establish some of the electrical interconnections between the conductive tracks of the corresponding daughter cards, while the other electrical interconnections are established using the bases connected to said connectors and electrical conductors of said mother card.

It will thus be understood that a fraction of the electrical connection elements, and more particularly of the conductor tracks that would otherwise have been implemented on the mother card, are implemented elsewhere because of the additional interconnection elements implemented on the assemblies formed by the daughter cards and their associated connectors.

In a first embodiment of the invention, the additional electrical connection elements are mounted on the connectors themselves and are connected to conductive tracks of the associated daughter cards.

In a second embodiment of the invention the additional electrical connection elements are disposed in support elements that project beyond the main faces of the daughter cards, the support elements being disposed close to the connectors of the daughter cards, said additional electrical connection elements being connected to conductor tracks of the daughter cards.

Other characteristics and advantages of the invention appear more clearly on reading the following description of various embodiments of the invention given by way of non-limiting example.

BRIEF DESCRIPTION OF THE DRAWINGS

The description refers to the figures in the accompanying drawings, in which:

FIG. 1, described above, is a diagram showing a known way of interconnecting daughter cards on a mother card;

FIG. 2, described above, is a perspective view of a known way of mounting daughter cards on a mother card;

FIG. 3 is a perspective view of a first interconnection system of the invention for daughter cards;

FIG. 4 is a diagram showing the electrical interconnections implemented by means of the embodiment of the invention shown in FIG. 3;

FIG. 5 is a perspective view of a second embodiment of the interconnection system of the invention; and FIG. 6 shows a variant of the first embodiment as shown in FIGS. 3 and 4.

DETAILED DESCRIPTION OF THE PREFERRED EMBODIMENTS

With reference initially to FIGS. 3 and 4, a first embodiment of an interconnection system between daughter cards on a mother card is described.

FIG. 3 reproduces the dispositions described above with reference to FIG. 2, and shows up the changes provided by the first embodiment of the invention.

In FIG. 3, there can be seen the mother card 10 with its bases 12 and 14 provided with their connection elements 16 and 18, with only one row thereof being shown, namely the row lying in the plane of the section. The figure also shows the daughter cards 20 and 22. In the first embodiment, the connectors 40 and 42 associated with the daughter cards 20 and 22 are of a special structure that is described in greater detail below.

The connectors 40 and 42 are of greater width in the horizontal direction (in the plane of the mother card 10) so that only a small amount of clearance e remains between facing side faces 40b and 42a. The term "side" faces is used with respect to the connectors 40 and 42 to designate those faces of the connectors which are substantially parallel to the planes of the corresponding daughter cards 20 and 22. FIG. 3 also shows a daughter card 23 and its connector 46 which is identical in shape to the connectors 40 and 42. In particular, only a small amount of clearance remains between the side face 46a of the connector 46 and the side face 42b of the connector 42.

The side faces 40b, 42a, 42b, 46a, etc. of the connectors 40, 42, and 46, etc. are provided with connection elements 47, 48, 50, 52 and 54 which are respectively male and female, and where the solid-line elements constitute only the row of such elements that is disposed in the same plane as the end section. In fact, there are a plurality of rows one behind the other in the direction perpendicular to the plane 3, i.e. along the long direction of the connectors. These connection elements are referred to as "additional" in order to distinguish them from the connection elements 28 and 30 which co-operate with the connection elements 16 and 18 of the bases. The additional connection elements are naturally alternately male and female so that facing additional elements are capable of being interconnected.

As in a known interconnection system, the connection elements 28 and 30 of the connectors 40 and 42 are electrically connected by means of conductors 54 and 56 to the conductor tracks (not shown in the figure) of the daughter cards 20 and 22. Similarly, the connection elements 16 and 18 of the bases 12 and 14 are connected by the conductors 58 and 60 to the conductive tracks 62 of the mother card 10.

The additional connection elements 47 and 48 of the connector 40 are connected to conductors 64 internal to the connector 40. These conductors 64 are themselves connected by conductors 66 to conductive tracks on the daughter card 20. The same applies to the connector 42.

It will be understood that interconnection between the various conductive tracks of the daughter cards, i.e. interconnection between the various electronic or electrical components, is thus provided not only by means of the conductors 62 of the mother card 10, but also by the conductors 64 associated with the connection elements 47, 48, 50, 52 of the connectors themselves.

As a result, while retaining the same number of conductors 62 in the mother card 10, it is possible to interconnect a larger number of components because of the interconnection conductors implemented in the connectors themselves, or alternatively, while retaining the same number of components to be interconnected, it is possible to reduce the number of conductors on the mother card, thereby making it possible to remedy the drawbacks mentioned above.

In addition, it should be emphasized that in this first embodiment, it is possible to use connectors that have standard ordinary connections, but that are themselves of increased width. Using this basic component, it is possible, at the request of a customer, to install additional connection elements and electrical connections within the connector, as a function of the special interconnections the customer seeks to implement.

Using the additional conductors 64 and 66 of each connector, all types of connection can be implemented between the additional connection elements, e.g. 47 and 48, and the tracks of the daughter card.

FIG. 5 shows a second embodiment of the invention. In this embodiment, the connectors 24 and 26 associated with the daughter cards 20 and 22 are identical to those of FIG. 1. They are constituted solely by "standard" connection elements 28 and 30 for co-operating with the connection elements 16 and 18 of the bases 12 and 14. This figure merely shows a third daughter card 23 together with its connector 27.

In this case, the additional interconnections are implemented from support elements 80 and 82 on the daughter card 20, 84 and 86 on the daughter card 22, and 88 on the daughter card 23.

These support elements are mechanically fixed to the main faces 20a & 20b, 22a & 22b, and 23a of the daughter cards and they project therefrom. The support elements are preferably located close to the connectors and they extend parallel thereto, i.e. parallel to the bases. Each support element includes a face 82a to 88a which is free and parallel to the corresponding daughter cards. The facing free faces of the support elements leave a small amount of clearance e between one another.

Additional connection elements 90, 92, 94, and 96 are mounted in the free faces of the support elements 80 to 88, the additional connection elements being alternately male and female so as to enable them to cooperate as shown in FIG. 5. This figure shows only one row of additional connection elements.

The additional connection elements 90 to 96 are connected to conductive tracks (not shown in the figure) of the daughter cards 20, 22, and 23 by means of electrical conductors 98, 100, 102, and 104 internal to the support elements 80 to 88.

It will thus be understood that new interconnection lines are implemented between the components of the daughter cards in addition to those that already exist in the mother card 10. This thus achieves the same advantages as those described with reference to the embodiment of FIGS. 3 and 4.

FIG. 6 shows a variant of the first embodiment of the invention as shown in FIGS. 3 and 4. This variant relates solely to the way in which the "additional" connection elements between the daughter cards are implemented.

FIG. 6 uses the same references as FIG. 3 for portions that remain unchanged. Thus, there can be seen the mother card 10 with its bases 12 and 14, the daughter cards 20 and 22 with their connectors referenced 40' and 42' since the connectors are modified relative to the connectors 40 and 42 of FIG. 3, in a manner explained below. The "conventional" male and female connection elements 16 & 28 and 18 & 30 serve to establish direct interconnections between the mother card 10 and the daughter cards 20 and 22. The modification relative to FIG. 3 consists in the way in which a portion of the "additional" connection elements between the connectors 40' and 42' is implemented. In the particular example shown, the connectors include two lines of internal conductors 64 and 64' in the section plane. The internal conductors 64 of the connectors are connected by female connection elements 65 and 67. Similarly, the internal conductors 64' are connected by a female connection element 65' or 67' which opens out into the vertical face 40'a or 42'a of the connectors 40', 42' and into respective recesses 69 and 71 formed in the bottom faces of the connectors 40' and 42'. These recesses are extended by slots formed in the faces 40'a and 42'a. Each pair of female connection elements 65 & 67 and 65' & 67' disposed face-to-face is interconnected by a double-ended male connection elements respectively referenced 73 or 73'. The male connection elements 73 and 73' are fixed on an insulating support 75 that projects into the recesses 69 and 71 of the connectors 40' and 42'. The connection elements 73 and 73' are disposed in such a manner that when the connectors 40' and 42' are connected onto the mother card 10, the double-ended connection elements 73 and 73' penetrate into the female connection elements 65 & 67 and 65' & 67', thereby establishing electrical connections between the internal conductors 64 and 64'. It will thus be understood that the volume available between two daughter cards during the operations of connecting and disconnecting the daughter cards on the mother card is increased by eliminating the male connection elements that project from the vertical faces of the connectors. In the event that the internal conductors 64 and 64' are offset, two different sets of double-ended male connection elements are provided situated at levels which correspond respectively to the female elements 65 & 67 and 65' & 67'. In this embodiment, the same clearance e of about 0.3 mm between adjacent connectors is retained.

In the above description of FIG. 6, it has been assumed that the pairs of connection elements 65 & 67 and 65' & 67' are female and that the double-ended connection elements 73 and 73' are male. Naturally, it would not go beyond the scope of the invention to invert the sex of the connection elements. Under such circumstances, the connection elements 65 & 67 and 65' & 67' would be male while the double-ended connection elements 73 and 73' would be female.

It will be understood that the embodiment of FIG. 6 may also be applied to the second embodiment of FIG. 5. The double-ended male connection elements must be mounted on support elements of sufficient size to ensure that the double-ended male connection elements can penetrate into both of the female connection elements then fitted to the vertical faces of the support pieces 82, 84, 86, etc., said vertical faces themselves including recesses.

I claim:

1. An electrical interconnection system for providing connections between a plurality of daughter card assemblies, each daughter card means being provided with a daughter card and an associated connector having first connection elements, the system also comprising a mother card including a plurality of bases for establishing electrical connections with said connectors associated with said daughter cards, wherein the first connection elements of each connector are electrically connected to conductor tracks of the associated daughter card, wherein some of the daughter card assemblies constituted by the connector and the associated daughter card include second electrical connection elements which are distinct from the first connection elements and which directly connect a daughter card with at least one adjacent daughter card assembly constituted by a connector and its associated daughter card without connection through the mother card, said second elements being adapted to establish some of the electrical interconnections between the conductive tracks of the corresponding daughter cards, while the other electrical interconnections are established using the bases connected to said connectors and electrical conductors of said mother card.

2. An electrical interconnection system according to claim 1, wherein at least some of said additional connection elements are mounted on said connectors and are connected to conductive tracks of the associated daughter cards by conductors of said connectors.

3. An electrical interconnection system according to claim 2, wherein all said additional connection elements are mounted on said connectors and are connected to conductive tracks of the associated daughter cards by conductors of said connectors.

4. An electrical interconnection system according to claim 3, wherein the connection elements of the connectors for connecting to the bases are disposed in a first face of said connectors, and the additional connection elements are disposed in two other faces of said connectors extending substantially parallel to the planes of the daughter cards.

5. An electrical interconnection system according to claim 2, wherein additional electrical connections between the connectors are constituted by pairs of connection elements disposed facing one another and mounted on said connectors, and by corresponding double-end connection elements secured to the mother card and disposed to co-operate with said pairs of connection elements when the corresponding daughter cards are mounted on the bases of said mother card.

6. An electrical interconnection system according to claim 5, wherein said pairs of connection elements are female and said double-ended connection elements are male.

7. An electrical interconnection system according to claim 5, wherein said pairs of connection elements are male and said double-ended connection elements are female.

8. An electrical interconnection system according to claim 1, wherein all said additional connection elements are mounted on said daughter card means.

9. An electrical interconnection system according to claim 8, further comprising support elements projecting from the main faces of the daughter cards, said support elements being disposed close to the connectors of the daughter card means said additional connection elements being disposed in said support elements and connected to conductive tracks of the daughter cards by conductors.

10. An electrical interconnection system according to claim 9, wherein said additional connection elements are mounted in faces of the support elements which are substantially parallel to the planes of the daughter cards.

* * * * *